(12) United States Patent
Miura

(10) Patent No.: US 6,392,479 B2
(45) Date of Patent: May 21, 2002

(54) AUTOMATIC GAIN CONTROLLER AND AUTOMATIC GAIN CONTROL METHOD, AND RADIO COMMUNICATIONS APPARATUS EQUIPPED WITH AUTOMATIC GAIN CONTROL FUNCTION

(75) Inventor: Nozomi Miura, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/796,918

(22) Filed: Mar. 1, 2001

(30) Foreign Application Priority Data

Mar. 3, 2000 (JP) ........................................ 2000-059025

(51) Int. Cl.[7] ................................................. H03G 3/20
(52) U.S. Cl. ....................... 330/129; 330/279; 455/234.1
(58) Field of Search ............................. 330/124 R, 129, 330/279; 455/232.1, 234.1, 245.1

(56) References Cited

U.S. PATENT DOCUMENTS

| | | | |
|---|---|---|---|
| 5,896,064 A | * 4/1999 | Kaku | .......................... 330/129 |
| 6,060,950 A | * 5/2000 | Groe | .......................... 330/129 |
| 6,229,397 B1 | * 5/2001 | Miura | .......................... 330/134 |
| 6,242,982 B1 | * 6/2001 | Ibelings et al. | ............. 330/129 |

* cited by examiner

Primary Examiner—Robert Pascal
Assistant Examiner—Khanh Van Nguyen
(74) Attorney, Agent, or Firm—Pearne & Gordon LLP

(57) ABSTRACT

An automatic gain controller has variable gain amplifiers ($11a$), ($11b$) for variably amplifying the input signals (RI1), (RI2) and a control loop that respectively performs automatic gain control of these variable gain amplifiers ($11a$), ($11b$) via feedback control of the output signal level. Variation amount in the detected output of the demodulated outputs (RD1), (RD2) is detected in the variation amount detector (20). The control section (19) selects the control loop where the output signal level is the highest when the variation amount is small and the system is in the stable state, and performs automatic gain control via a gain control signal in this control loop and correction gain control signals in the other control loops, and places in the non-operating state the gain control signal generator of the other control loops.

13 Claims, 11 Drawing Sheets

AUTOMATIC GAIN CONTROLLER AND AUTOMATIC GAIN CONTROL METHOD, AND RADIO COMMUNICATIONS APPARATUS EQUIPPED WITH AUTOMATIC GAIN CONTROL FUNCTION

BACKGROUND OF THE INVENTION

The present invention relates to automatic gain control that makes constant the output signal level via gain control using the closed loop, and in particular to an automatic gain controller and an automatic gain control method wherein automatic gain control of a plurality of input signals is performed and to radio communications apparatus equipped with the automatic gain control function.

Conventionally, in some types of signal processors, for example radio communications apparatus, automatic gain control is performed in order to make constant the variation in the signal level of a received signal caused by variation of receiving field strength in a radio propagation path such as a radio circuit and to reduce demodulation errors. As such gain control signal systems are known an open loop control signal whereby the gain of a variable gain amplifier in the subsequent stage is controlled via an automatic gain control signal generated by detecting the level variation in an input signal, and a closed loop control system whereby the gain of a variable gain amplifier in the preceding stage is controlled via the automatic gain control signal.

FIG. 11 shows an example of configuration of an automatic gain controller according to the related art applied to the receiving system of radio communications apparatus. The automatic gain controller is composed of a variable gain amplifier 111, a demodulator 112, an A/D converter 113, a level detector 114, a gain control signal generator 115, and a D/A converter 116.

In the automatic gain controller according to the related art, a received signal input Ri is amplified by the variable gain amplifier 111, demodulated by the demodulator 112, and converted to a digital value by the A/D converter 113, then output as a demodulated output Rd. Part of the demodulated output Rd is level-detected by the level detector 114 and captured by an automatic gain control loop, to generate an gain control signal via the gain control signal generator 115 based on the value of the demodulated output Rd. This automatic gain control signal is converted to an analog voltage by the D/A converter 116 and fed back to the control input end of the variable gain amplifier 111 as a gain control voltage and undergoes automatic gain control via the closed loop.

In the gain control signal generator 115, the value of the demodulated output Rd (output value) level-detected by the level detector 114 is averaged by an averaging section 121 for a certain time, and the difference from a predetermined target value A is calculated in a convergence difference calculating adder 122. In a loop gain control multiplier 123, the loop gain control value B in the automatic gain controller is multiplied in a loop gain control multiplier 123 and sent to an adder 124. In the adder 124, the previous value latched by a latch circuit 125 is added to the variation amount output from the loop gain control multiplier 123 and the resulting value is sent to an operating section 126 via the latch circuit 125. The adder 124 and the latch circuit 125 composes an integration circuit and an integration value is latched by the latch circuit with the timing of a latch timing control value D. In the operating section 126, the integrating value is converted to data corresponding to the control voltage of the variable gain amplifier 111 and fed back to the control input end of the variable gain amplifier 111 as a gain control voltage. This realizes automatic gain control so that the output level of the variable gain amplifier 111 (output value of the level detector 114) may converge to a target value A.

Some types of radio communications apparatus that performs automatic gain control as mentioned earlier have receivers of a plurality of systems. In the related art, automatic gain controllers were provided as many as the number of receiving systems to correspond to receivers. That is, automatic gain controllers as shown in FIG. 11 were provided as many as the number of receiving systems and automatic gain control was individually performed in each receiver. In particular, it was necessary to provide an automatic gain controller for each receiver in order to obtain the optimum automatic gain control performance depending on the operating status in each receiving system.

In radio communications apparatus according to the related art having aforementioned receivers of a plurality of systems, as many automatic gain controllers as the number of receiving systems are provided. Thus, a plurality of automatic gain controllers were always operating, which causes a problem that the circuit scale and power consumption were increased. Power consumption of a circuit increases in proportion to the number of systems even if the automatic gain controller is configured by way of software design. Even if a single automatic gain control loop was used in common among a plurality of receiving systems in order to reduce power consumption, it was impossible to fully correct variations in the circuit characteristics such as the temperature characteristics and frequency characteristics of a variable gain amplifier of each system, thus the optimum automatic gain control performance was not obtained. In particular, in an unstable system state such as the power on or intermittent data reception, or in a bad receiving state, i.e., when variation in the receiving level is large or fading has taken place, high-accuracy automatic gain control is required. In the configuration according to the related art, a proper gain control signal is not obtained and desired automatic gain control cannot be performed.

SUMMARY OF THE INVENTION

The invention, in view of the aforementioned circumstances, aims at providing an automatic gain controller and an automatic gain control method wherein automatic gain control of a plurality of systems can be performed depending on the operating state such as the stable/unstable signal level and power consumption can be reduced, and to radio communications apparatus equipped with the automatic gain control function.

An automatic gain controller according to the invention is a automatic gain controller having variable gain amplifiers of a plurality of systems and the corresponding control loops, comprising: a gain control signal generator which generates a gain control signal that controls a variable gain amplifier based on the output signal level of the variable gain amplifier; a variation amount detector which detects the variation amount of the output signal level; a level comparator which compares the output signal levels of the plurality of system with each other; an inter-control-loop correction section which generates a correction gain control signal that corrects variations in the circuit characteristics of the other control loops and that is based on a gain control signal in the control loop where the output signal level is the highest in order to perform gain control, and an operation controller which selects the control loop where the output signal level is the highest, places gain control signal generator for the other control loops in the non-operating state, and performs gain control of the variable gain amplifiers of the plurality of systems via the gain control signal in the control loop where the output signal level is the highest and correction gain control signals in the other control loops, in case the variation amount in the output signal level is smaller than a predetermined value.

The operation controller preferably places in the operating state the gain control signal generator for the control loops of the plurality of systems and performs gain control of the variable gain amplifier via a gain control signal in each control loop, in case the variation amount in the output signal level is larger than the predetermined value.

Preferably, the operation controller operates the gain control signal generator for each control loop in a predetermined period during system startup from the non-operational state at power-on, to perform gain control of the variable gain amplifier. Or, the operation controller operates the gain control signal generator for each control loop until the variation amount in the output signal level falls within a predetermined value during system startup from the non-operational state at power-on, to perform gain control of the variable gain amplifier.

Preferably, the operation controller operates the gain control signal generator for each control loop in a predetermined period during system startup from the non-operational state assumed in case intermittent operation is performed, to perform gain control of the variable gain amplifier. Or, the operation controller operates the gain control signal generator for each control loop until the variation amount in the output signal level falls within a predetermined value during system startup from the non-operational state assumed in case intermittent operation is performed, to perform gain control of the variable gain amplifier.

An automatic gain control method according to the invention is an automatic gain control method using variable gain amplifiers of a plurality of systems and the corresponding control loops, comprises: a gain control signal generating step for generating a gain control signal that controls a variable gain amplifier based on the output signal level of the variable gain amplifier; a variation amount detecting step for detecting the variation amount of the output signal level; a level comparison step for comparing the output signal levels of the plurality of system with each other; an inter-control-loop correction step for generating a correction gain control signal that corrects variations in the circuit characteristics of the circuit characteristics of the other control loops and that is based on a gain control signal in the control loop where the output signal level is the highest in order to perform gain control; and an operation control step for selecting the control loop where the output signal level is the highest, placing gain control a signal generator for the other control loops in the non-operating state, and performing gain control of the variable gain amplifiers of the plurality of systems via the gain control signal in the control loop where the output signal level is the highest and correction gain control signals in the other control loops, in case the variation amount in the output signal level is smaller than a predetermined value.

The operation control step preferably places in the operating state the gain control signal generator for the control loops of the plurality of systems and performs gain control of the variable gain amplifier via a gain control signal in each control loop, in case the variation amount in the output signal level is larger than the predetermined value.

Preferably, the operation control step operates the gain control signal generator for each control loop in a predetermined period during system startup from the non-operational state at power-on, to perform gain control of the variable gain amplifier. Or, the operation control step operates the gain control signal generator for each control loop until the variation amount in the output signal level falls within a predetermined value during system startup from the non-operational state at power-on, to perform gain control of the variable gain amplifier.

Preferably, the operation control step operates the gain control signal generator for each control loop in a predetermined period during system startup from the non-operational state assumed in case intermittent operation is performed, to perform gain control of the variable gain amplifier. Or, the operation control step operates the gain control signal generator for each control loop until the variation amount in the output signal level falls within a predetermined value during system startup from the non-operational state assumed in case intermittent operation is performed, to perform gain control of the variable gain amplifier.

Radio communications apparatus according to the invention has receivers of a plurality of systems comprising a automatic gain controller according to any of the foregoing aspects of the invention, the radio communications apparatus performing automatic gain control for making constant the output signal level concerning a received signal via the automatic gain controller.

In the aforementioned configuration, a gain control signal is generated based on the output signal level of the variable gain amplifier in obtaining a constant output signal by variably amplifying input signals of a plurality of systems respectively via the variable gain amplifier, and the variation amount in the output signal level is detected. In case the variation amount in the output signal level is smaller than the predetermined value, the automatic gain controller selects the control loop where the output signal level is the highest, places gain control signal generator for the other control loops in the non-operating state, and performs gain control of the variable gain amplifiers of the plurality of systems via a gain control signal in the control loop where the output signal level is the highest and correction gain control signals in the other control loops, in case the variation amount in the output signal level is smaller than a predetermined value. In case the variation amount in the output signal level is larger than the predetermined value, the automatic gain controller places in the operating state the gain control signal generator for the control loops of the plurality of systems and performs gain control of the variable gain amplifier via a gain control signal in each control loop.

In case system operation is unstable and high-accuracy gain control is required such as in a predetermined period during system startup from the non-operational state at power-on, in a predetermined period during system startup from the non-operational state assumed in case intermittent operation is performed, and until the variation amount in the output signal level falls within a predetermined value during system startup from the non-operational state, the automatic gain controller operates the gain control signal generator for each control loop to perform gain control of the variable gain amplifier. Operation control made in case the intermittent operation is performed is preferably applied to a case where intermittent data reception is performed in radio communications apparatus.

In the aforementioned steady state, assuming the predetermined value for decision of switching operation between control loops as K1, the predetermined value for decision of switching operation at power-on, as K2, and the predetermined value for decision of switching operation in system startup in case intermittent operation is performed as K3, preferably K2>K3>K1 in order to upgrade the accuracy of detecting the variation amount in the output signal level or operation switching control.

Via the aforementioned operation control, it is possible to reduce the power consumption of a automatic gain controller while performing proper automatic gain control in a plurality of systems, by placing in the non-operating state part of the circuits such as the gain control signal generator of the automatic gain controller and correcting the other control loops based on the automatic gain control signal for a control loop where the output signal level is the highest, when the output signal level is stable. By applying an automatic gain controller and an automatic gain control method to radio communications apparatus, it is possible to reduce power consumption while securing good receiving performance, thus allowing long-duration operation.

DETAILED DESCRIPTION OF THE PREFERRED EMBODIMENTS

Figure 1:
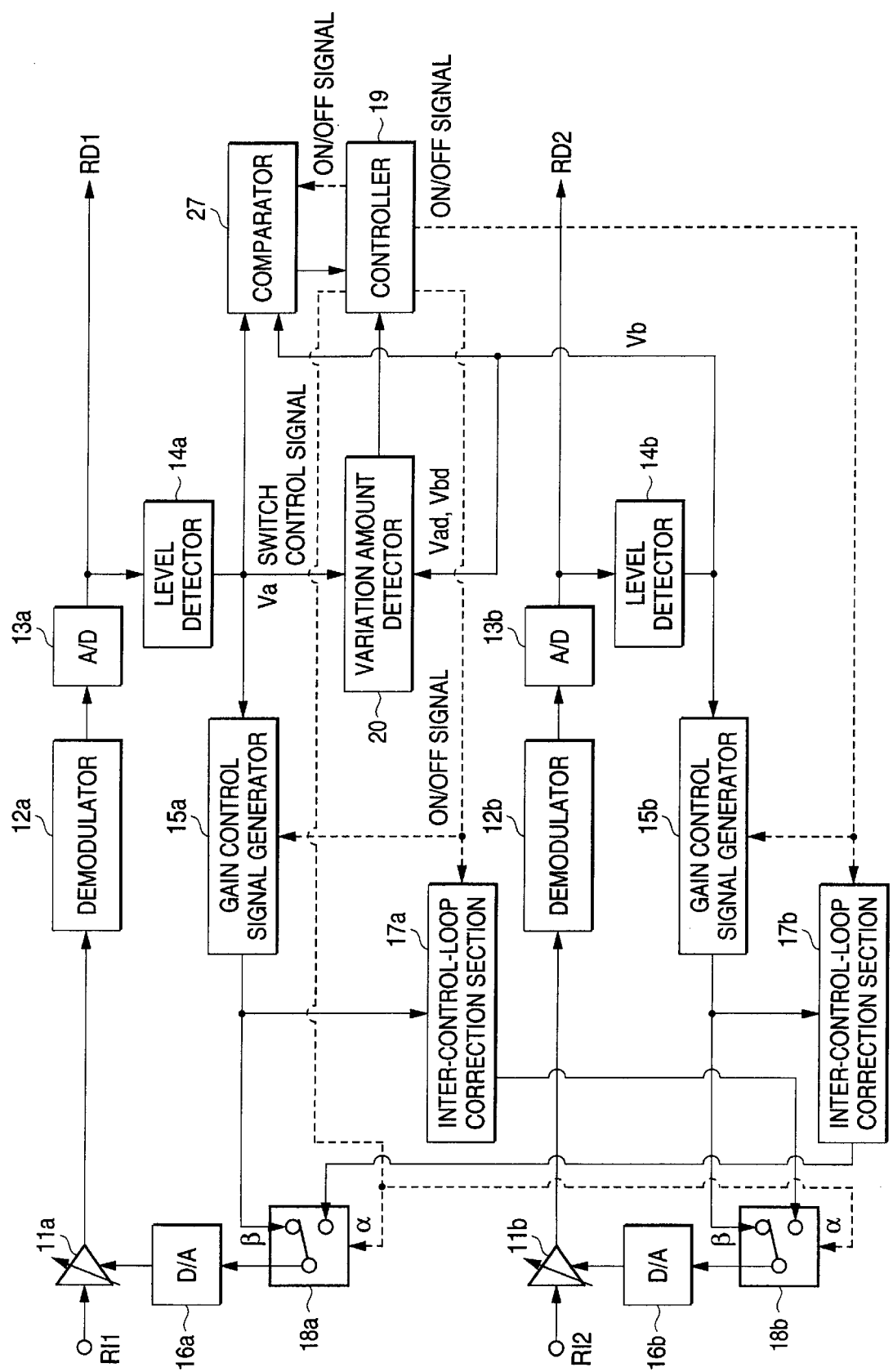
FIG. 1 is a block diagram showing the configuration of an automatic gain controller according to an embodiment of the invention.
Figure 2:
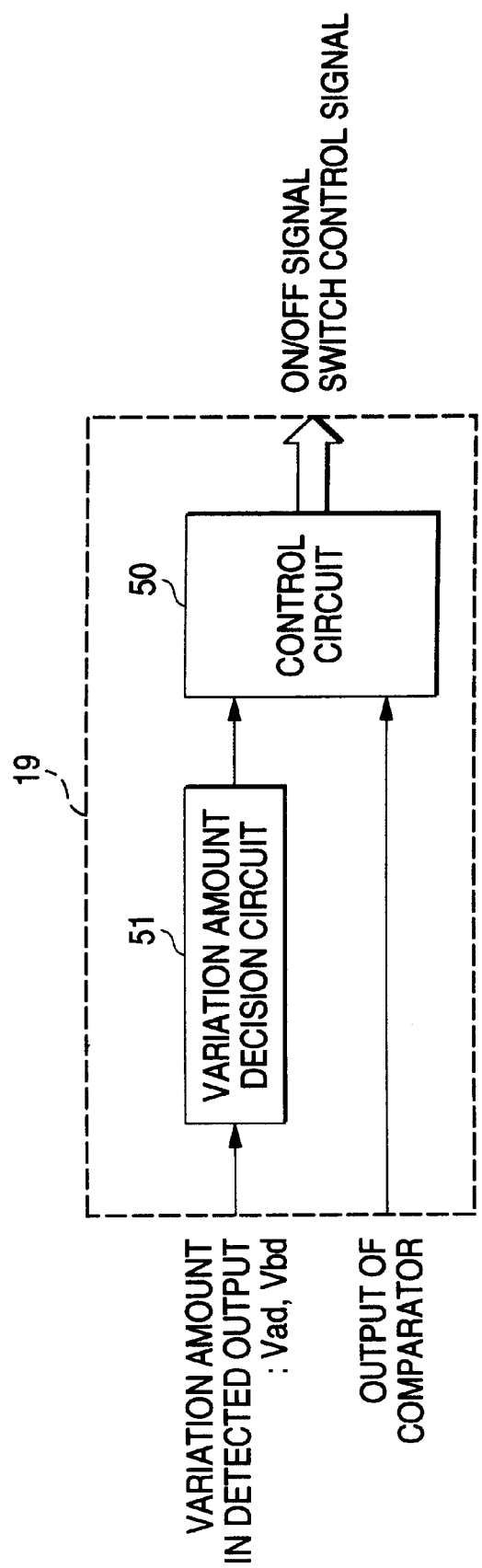
FIG. 2 is a block diagram showing the internal configuration of a control section according to the first embodiment.
Figure 3:
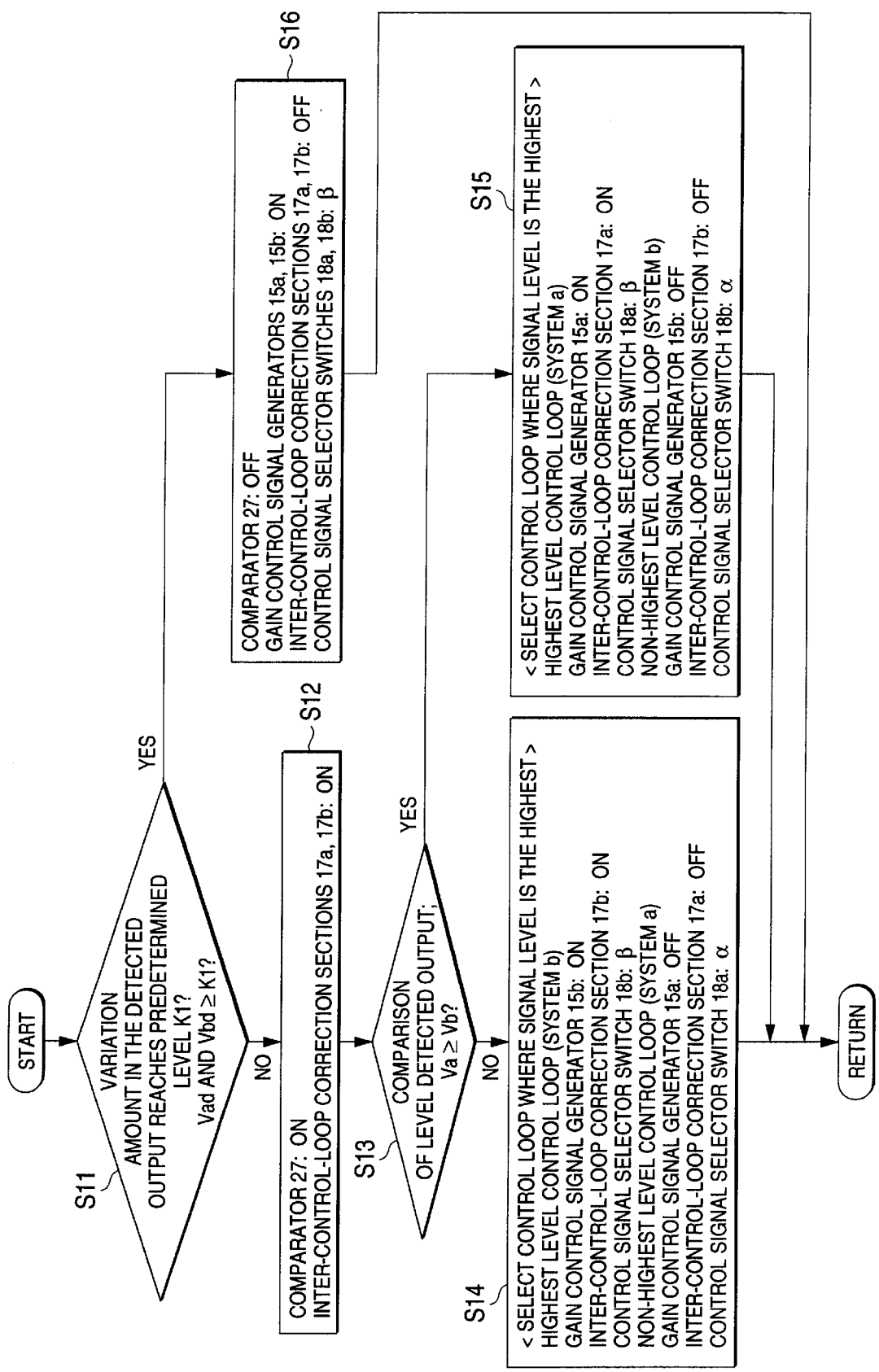
FIG. 3 is a flowchart showing the processing procedure concerning automatic gain control according to the first embodiment.

Embodiments of the invention will be described referring to the drawings.
[First Embodiment]
FIG. 1 is a block diagram showing the configuration of an automatic gain controller according to the invention. FIG. 2 is a block diagram showing the internal configuration of a control section according to the first embodiment. FIG. 3 is a flowchart showing the processing procedure concerning automatic gain control according to the first embodiment.

This embodiment shows a case where an automatic gain controller is applied to radio communications apparatus having receivers of a plurality of systems (two systems in this embodiment) used in mobile communications systems such as portable telephone sets. The automatic gain controller has automatic gain control loops of a plurality of systems (two systems). Hereinafter, the control system for the input signal RI1 in FIG. 1 is referred to as system a, and the control system for the input signal RI2 is referred to as system b. The automatic gain control is abbreviated as the AGC as required.

An automatic gain controller has variable gain amplifiers 11$a$, 11$b$ for variably amplifying the input signals RI1, RI2 and an AGC closed loop system (hereinafter referred to simply as the control loop) that respectively performs automatic gain control of these variable gain amplifiers 11$a$, 11$b$ via feedback control of the output signal level. The automatic gain controller comprises demodulators 12$a$, 12$b$ for demodulating the output signals of variable gain amplifiers 11$a$, 11$b$, A/D converters 13$a$, 13$b$ for converting the output signals of the demodulators 12$a$, 12$b$ to digital signals and outputting the resulting signals, level detectors 14$a$, 14$b$ for detecting the signal level of the demodulated outputs RD1, RD2 digitally converted by the A/D converters 13$a$, 13$b$, and gain control signal generators 15$a$, 15$b$ for generating gain control signals based on the outputs from the level detectors 14$a$, 14$b$.

The automatic gain controller also comprises: inter-control-loop correction sections 17$a$, 17$b$ for generating a correction gain control signal that corrects the other control systems and that is based on one gain control signal selected from among the outputs of the gain control signal generators 15$a$, 15$b$; a variation amount detector 20 for detecting the variation amount in the detected output of at least one system of the level detectors 14$a$, 14$b$; a comparator 27 for comparing between the detected outputs Va, Vb of the level detector 14$a$, 14$b$; a control section 19 for performing switching control of operation/non-operation (on/off) state of the gain control signal generators 15$a$, 15$b$ the inter-control-loop correction sections 17$a$, 17$b$ and a comparator 27, based on the variation amounts Vad, Vbd in the detected output detected by the variation amount detector 20 and the output of the comparator 27; control signal selector switches 18$a$, 18$b$ for switching between the output of the gain control signal generators 15$a$, 15$b$ and the output of the inter-control-loop correction section 17$a$, 17$b$; and D/A converters 16$a$, 16$b$ for converting the gain control signal or correction gain control signal output from the control signal selector switches 18$a$, 18$b$ to an analog signal.

The inter-control-loop correction sections 17$a$, 17$b$ generate and output a correction gain control signal containing correction of variations in the circuit characteristics such as the temperature characteristics and frequency characteristics of the other control loops for the gain control signals selected by the control signal selector switches 18$a$, 18$b$. The control section 19 outputs a switching control signal to the control signal selector switches 18$a$, 18$b$ based on the comparison results in the comparator 27, and makes control so that the contact β is selected for the control loop of the highest detected output level detected by the comparator 27 (hereinafter referred to as highest level control loops) and the contact α is selected for the other control loops (hereinafter referred to as non-highest level control loops).

Functional configuration inside the control section 19 is shown in FIG. 2. The control section 19 comprises a variation amount decision circuit 51 for determining whether the variation amount Vad, Vbd in the detected output detected by the variation amount detector 20 has reached a predetermined value and a control circuit 50 for generating an on/off signal for performing on/off switching of the gain control signal generator 15a, 15b, the inter-control-loop correction sections 17a, 17b and a comparator 27, based on the decision results of the variation amount decision circuit 51 and the comparison result output of the comparator 27.

Next, operation of the automatic gain controller according to the first embodiment will be described with reference to FIGS. 1–3. Input signals RI1, RI2 to the systems are respectively amplified by the variable gain amplifiers 11a, 11b, demodulated by the demodulators 12a, 12b, converted to digital signals by the A/D converters 13a, 13b, and output as demodulated outputs RD1, RD2. The demodulated outputs RD1, RD2 are respectively detected by the level detectors 14a, 14b and the detected outputs Va, Vb are sent to the variation amount detector 20. The variation amount detector 20 detects the variation amounts Vad, Vbd in the detected outputs Va, Vb, and the detection results are output to the control section 19 as the variation amounts Vad, Vbd in the detected output.

According to FIG. 3, the control section 19 compares the variation amounts Vad, Vbd in the detected output with a predetermined threshold K1 used in the variation amount decision circuit 51 in step S11. In step S11, in case the variation amount in the input signals RI1, RI2 is small and either the variation amount Vad or Vbd in the detected output is smaller than the preset threshold K1 (Vad or Vbd<K1), an on/off signal for turning on the operation of the comparator 27 and the inter-control-loop correction sections 17a, 17b is output from the control circuit 50 in step S12. This is for example a case where the receiving field strength is substantially constant and stable in radio communications apparatus, and in such a case the variation amounts Vad, Vbd in the detected output are small.

Next, the comparator 27 compares between the detected outputs Va, Vb of the level detectors 14a, 14b in step S13. The control section 19 performs operation switching as mentioned below when the comparison result shows that Vb is larger than Va (Va<Vb) in step S14. That is, the control section selects system b as the highest level control loop and places in the ON state (operating state) the gain control signal generator 15b and the inter-control-loop correction section 17b of system b, and sets the control signal selector switch 18b in the contact β position. This allows the gain control signal generated by the gain control signal generator 15b to be supplied to the control input end of the variable gain amplifier 11b via the D/A converter 16b and the control loop of system b undergoes the optimum automatic gain control via this gain control signal.

The control section 19 determines system a as a non-highest level control loop and places in the OFF state (non-operating state) the gain control signal generator 15a and the inter-control-loop correction section 17a of system a, and sets the control signal selector switch 18a in the contact α position. This allows the correction gain control signal generated by the inter-control-loop correction section 17b to be supplied to the control input end of the variable gain amplifier 11a via the D/A converter 16a and the control loop of system a undergoes automatic gain control via this correction gain control signal. For system a as the non-highest level control loop, the variable gain amplifier 11a is controlled by a correction gain control signal with variations in the circuit characteristics such as the temperature characteristics and frequency characteristics of the circuit of system a corrected by the inter-control-loop correction section 17b, based on the gain control signal generated by the gain control signal generator 15b of system b selected as the highest level control loop. This allows the optimum automatic gain control to be performed.

In step S13, the control section 19 performs operation switching as mentioned below when the comparison result in step S13 shows that Va is larger than or equal to Vb (Va≧Vb). That is, the control section selects system a as the highest level control loop and places in the ON state (operating state) the gain control signal generator 15a and the inter-control-loop correction section 17a of system a, and sets the control signal selector switch 18a in the contact β position. This allows the gain control signal generated by the gain control signal generator 15a to be supplied to the control input end of the variable gain amplifier 11a via the D/A converter 16a and the control loop of system a undergoes the optimum automatic gain control via this gain control signal.

The control section 19 determines system b as a non-highest level control loop and places in the OFF state (non-operating state) the gain control signal generator 15b and the inter-control-loop correction section 17b of system b, and sets the control signal selector switch 18b in the contact position. This allows the correction gain control signal generated by the inter-control-loop correction section 17a to be supplied to the control input end of the variable gain amplifier 11b via the D/A converter 16b. For the control loop of system b, the variable gain amplifier 11b is controlled by a correction gain control signal with variations in the circuit characteristics such as the temperature characteristics and frequency characteristics of the circuit of system b corrected by the inter-control-loop correction section 17a, based on the gain control signal generated by the gain control signal generator 15a of system a selected as the highest level control loop. This allows the optimum automatic gain control to be performed.

In step S11, in case the variation amount in the input signals RI1, RI2 is large and both of the variation amount Vad and Vbd in the detected output are larger than or equal to the preset threshold K1 (Vad and Vbd≧K1), operation switching is made in the following way in step S16. The control section turns ON the gain control signal generators 15a, 15b and turns OFF the comparator 27 and the inter-control-loop correction sections 17a, 17b as well as sets the control signal selector switches 18a, 18b in the contact β position. This is for example a case where the receiving field strength is small or variation is large and the receiving state is unstable. In such a case, the variation amounts Vad, Vbd in the detected output are large. Automatic gain control is performed individually in each control loop and the optimum automatic gain control is executed in each system.

As mentioned earlier, in the first embodiment, in case the variation amount in the detected output, that is, in case the input signal level is small and the level is stable and automatic gain control characteristics are not impaired by the use of an approximate gain control signal, a control loop where the output signal level is the highest is selected and automatic gain control is performed using the gain control signal in the highest-level control loop. For the other control loops, a correction gain control signal containing correction of variations in circuit characteristics in each control loop is generated based on the gain control signal to perform automatic gain control. This allows each control system to perform proper automatic gain control via a gain control signal that supports variations in the circuit characteristics such as the temperature characteristics and frequency characteristics of the variable gain amplifier. In this case, operation of the gain control signal generators in the control loops other than the highest level control loop is turned OFF so that power consumption can be reduced if the control loop circuit is configured via hardware electronics. In case the control loop circuit is configured via the MPU (microprocessor unit) or DSP (digital signal processor) and operated via software programming, both the processing time and the power consumption are reduced.

In case automatic gain control is performed with the control loop where the input signal level is the highest is selected, no excessive signals are input to the other control loops that are not selected. This avoids the disadvantage that the A/D converter in the subsequent stage of the variable gain amplifier is saturated.

On the other hand, in case variation amount in the detected output, that is, in case the input signal level is large and the level is unstable thus high-accuracy automatic gain control is required, a gain control signal is generated in each control loop and automatic gain control is performed individually. This executes the optimum high-accuracy automatic gain control in each control system.

In the second to fifth embodiments that follow, examples are shown where operation of the control section 19 according to the first embodiment is modified. Since the configuration of the automatic gain controller is the same as that of the first embodiment, the corresponding description is not given.

[Second Embodiment]

Figure 4:
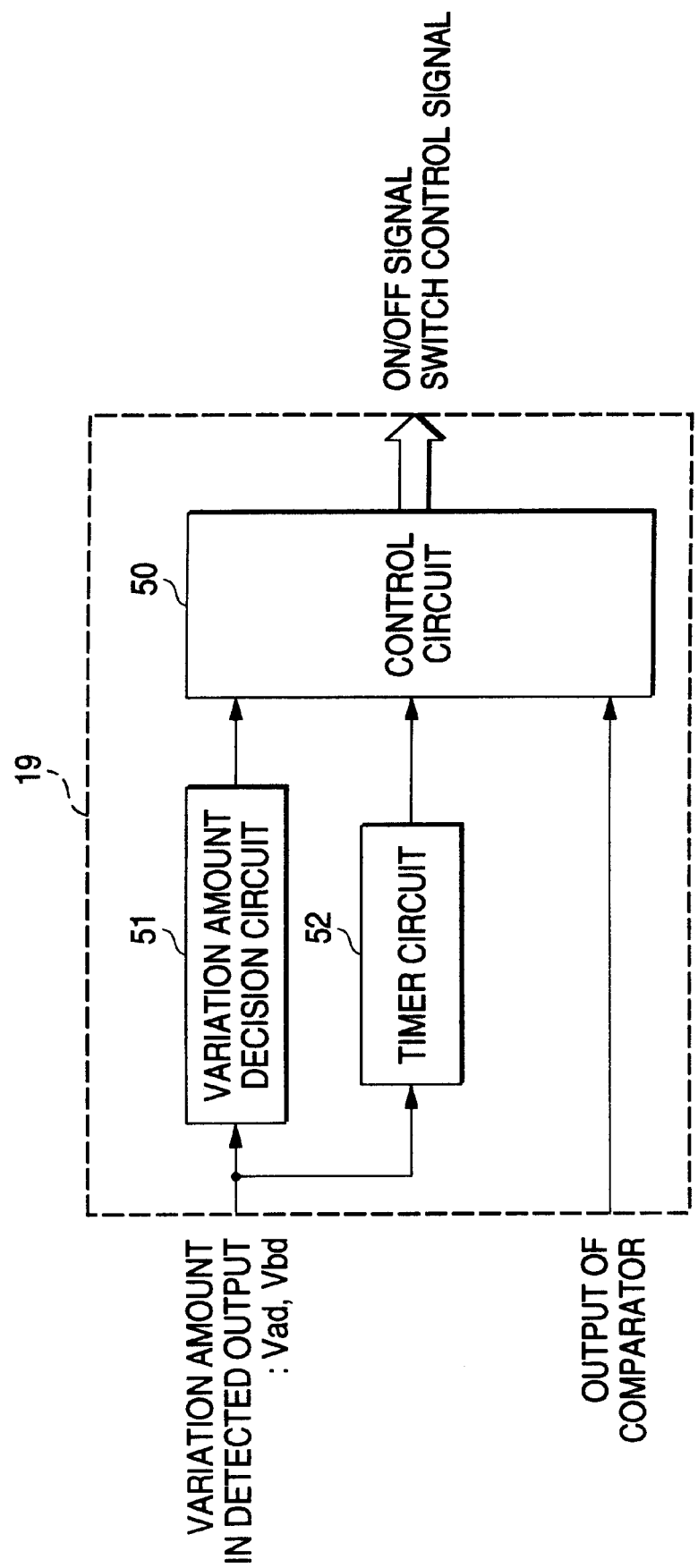
FIG. 4 is a block diagram showing the internal configuration of a control section according to the second embodiment.
Figure 5:
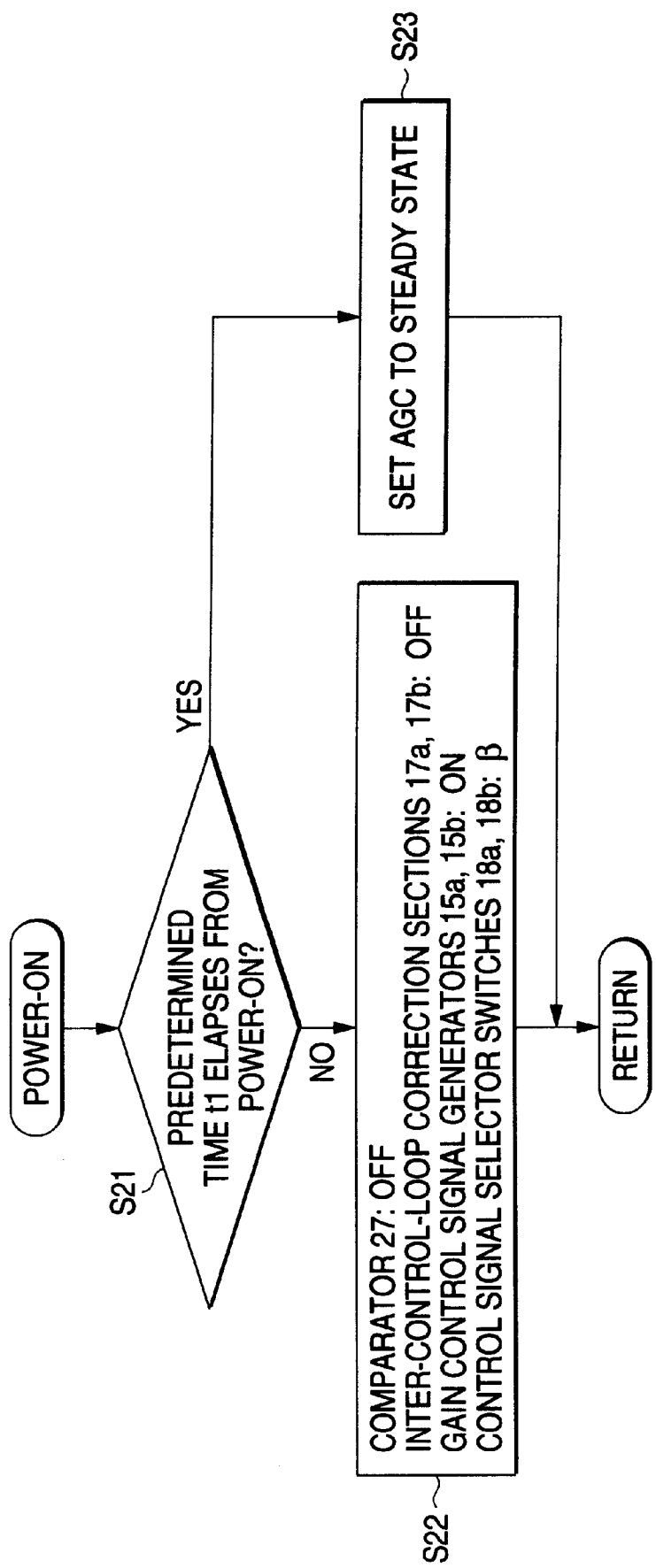
FIG. 5 is a flowchart showing the processing procedure concerning automatic gain control according to the second embodiment.

FIG. 4 is a block diagram showing the internal configuration of a control section according to the second embodiment. FIG. 5 is a flowchart showing the processing procedure concerning automatic gain control according to the second embodiment.

The automatic gain controller according to the second embodiment comprises, as the functional configuration of the control section 19, a variation amount decision circuit 51 for determining whether the variation amount Vad, Vbd in the detected output has reached a predetermined value, a timer circuit 52 for counting the elapsed time from when the automatic gain controller is powered, and a control circuit 50 for performing on/off switching of the gain control signal generator 15a, 15b, the inter-control-loop correction sections 17a, 17b and a comparator 27, based on the output of the variation amount decision circuit 51 and the timer circuit 52 as well as the comparison result output of the comparator 27.

Next, operation of the automatic gain controller according to the second embodiment will be described. In the second embodiment, inter-loop correction of the gain control signal is not made but a gain control signal is generated in each control loop to perform individual automatic gain control in the state where the automatic gain controller is powered (initial state), that is, in a certain period during system startup from the non-operating state to the operating state, and control in the first embodiment is performed when the certain period has elapsed.

When the automatic gain controller is powered and started, automatic gain control is started via a gain control signal so that the preset initial value or conversion value is approached while counting of the predetermined time t1 (sec.) is started via the timer circuit 52. The control section 19 determines whether the predetermined time t1 (sec.) has elapsed from when the power is turned on, based on the output from the timer circuit 52 in step S21.

When the predetermined time t1 (sec.) has not yet elapsed from when the power is turned on in step S21, the automatic gain controller places in the ON state (operating state) the gain control signal generators 15a, 15b and places in the OFF state (non-operating state) the inter-control-loop correction sections 17a, 17b and the comparator 27 as well as sets the control signal selector switches 18a, 18b in the contact β position, in step S22. This allows each control loop to perform individual automatic gain control and proper automatic gain control is executed in each control system.

When the predetermined time t1 (sec.) has elapsed from when the power is turned on, the automatic gain controller performs automatic gain control operation in the steady state, that is, automatic gain control operation in the first embodiment in step S23. In this case, switching is made between the control via the gain control signal in each control loop and the control via the gain control signal in the highest level control loop and the correction gain control signal in the non-highest level control loops, depending on the magnitude of the variation amounts Vad, Vbd in the detected output.

The entire control section 19 may be configured via the MPU (microprocessor unit) or DSP (digital signal processor) and the timer circuit 52 may be realized via a software timer or a hardware circuit. The timer circuit 52 is power-on reset at power-on and starts counting time.

In this way, in the second embodiment, in a certain period during system startup from the non-operating state to the operating state at power-on of the automatic gain controller, that is, in an unstable state where a large variation amount in the input signal level at the power-on operation is expected and high-accuracy automatic gain control is required, selective control is not made where operation of the control loops other than the control loop that obtains the maximum detected output is turned OFF to perform inter-control-loop correction but a gain control signal is generated in each control loop in a fixed way to perform individual automatic gain control. This executes the optimum high-accuracy automatic gain control in each control system.

[Third Embodiment]

Figure 6:
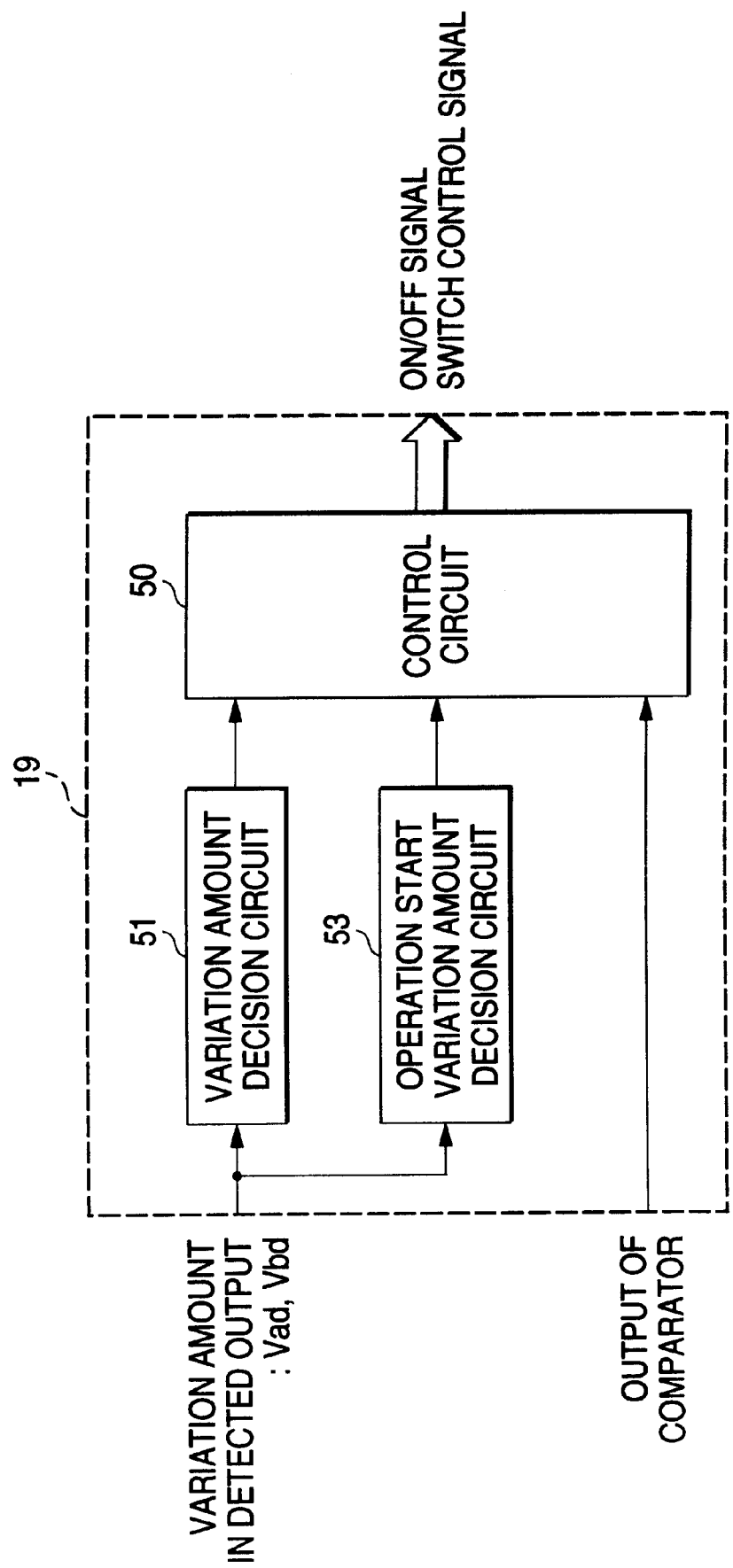
FIG. 6 is a block diagram showing the internal configuration of a control section according to the third embodiment.
Figure 7:
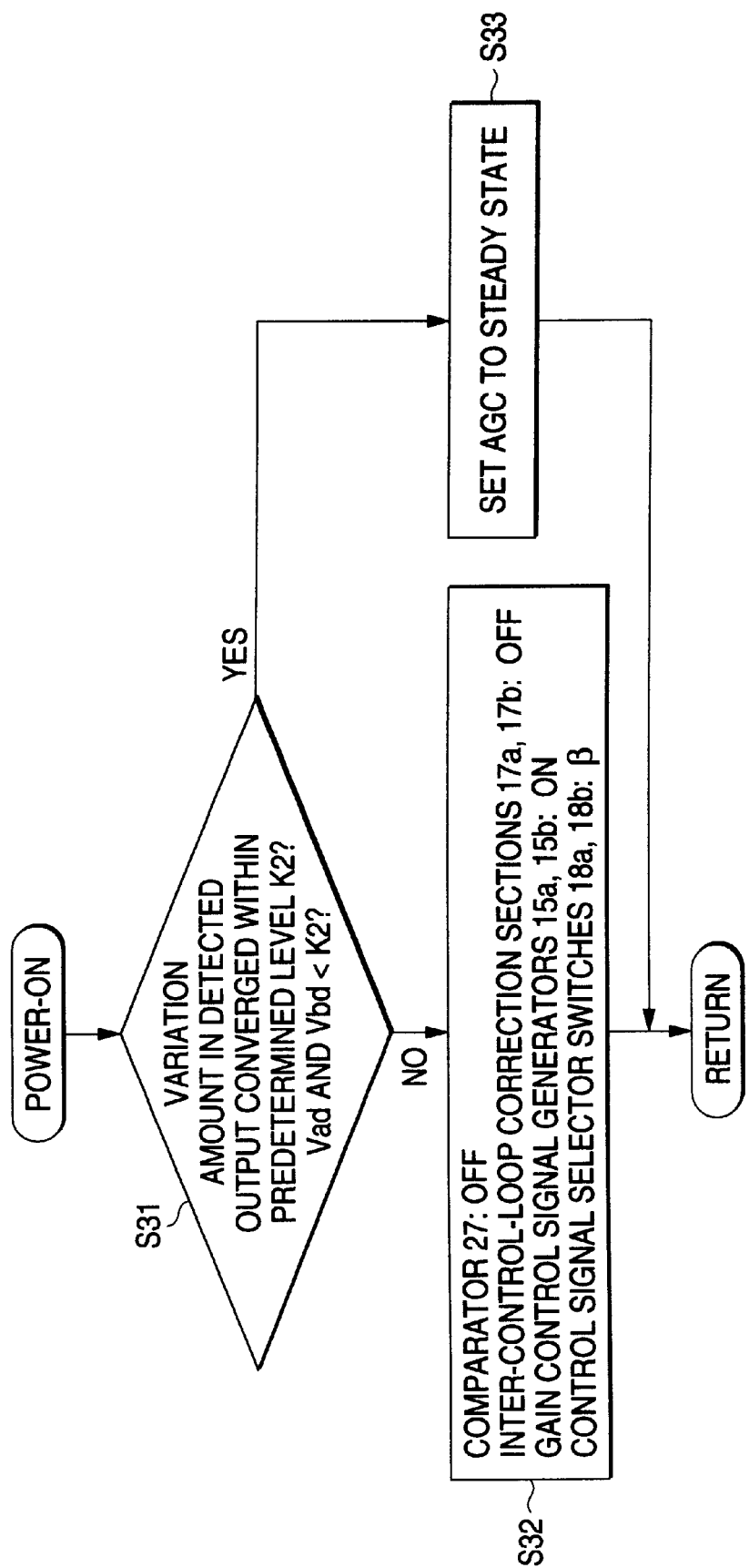
FIG. 7 is a flowchart showing the processing procedure concerning automatic gain control according to the third embodiment.

FIG. 6 is a block diagram showing the internal configuration of a control section according to the third embodiment. FIG. 7 is a flowchart showing the processing procedure concerning automatic gain control according to the third embodiment.

The automatic gain controller according to the third embodiment comprises, as the functional configuration of the control section 19, a variation amount decision circuit 51 for determining whether the variation amount Vad, Vbd in the detected output in the steady operation has reached a predetermined value, an operation start variation amount decision circuit 53 for determining whether the variation amount Vad, Vbd in the detected output at power-on operation has reached a predetermined value, and a control circuit 50 for performing on/off switching of the gain control signal generator 15a, 15b, the inter-control-loop correction sections 17a, 17b and a comparator 27, based on the output of the variation amount decision circuit 51 and the operation start variation amount decision circuit 53 as well as the comparison result output of the comparator 27.

Next, operation of the automatic gain controller according to the third embodiment will be described. In the third embodiment, inter-loop correction of the gain control signal is not made but a gain control signal is generated in each control loop to perform individual automatic gain control in case variation amount in the detected output is large in the state where the automatic gain controller is powered (initial state), that is, during system startup from the non-operating state to the operating state, and control in the first embodiment is performed when the variation amount in the detected output has fallen within a predetermined level.

When the automatic gain controller is powered and started, automatic gain control is started via a gain control signal so that the preset initial value or conversion value is approached and the operation start variation amount decision circuit 53 determines whether the variation amounts Vad, Vbd have converged to a predetermined level K2 (for example K2>K1) in step S31.

In case the variation amounts Vad, Vbd in the detected output are equal to or larger than the predetermined level K2 (Vad or Vbd≧K2) in step S31, the automatic gain controller places in the ON state (operating state) the gain control signal generators 15*a*, 15*b* and places in the OFF state (non-operating state) the inter-control-loop correction sections 17*a*, 17*b* and the comparator 27 as well as sets the control signal selector switches 18*a*, 18*b* in the contact β position, in step S32. This allows each control loop to perform individual automatic gain control and proper automatic gain control is executed in each control system.

In case the variation amounts Vad, Vbd in the detected output are smaller than the predetermined level K2 (Vad and Vbd<K2), the automatic gain controller performs automatic gain control operation in the steady state, that is, automatic gain control operation in the first embodiment in step S33. In this case, switching is made between the control via the gain control signal in each control loop and the control via the gain control signal in the highest level control loop and the correction gain control signal in the non-highest level control loops, depending on the magnitude of the variation amount Vad, Vbd in the detected output.

In this way, in the third embodiment, during system startup from the non-operating state to the operating state at power-on of the automatic gain controller, that is, in an unstable state where a large variation amount in the input signal level is expected and high-accuracy automatic gain control is required, selective control is not made where the variation amount in the detected output is determined and operation of the control loops other than the control loop that obtains the maximum detected output is turned OFF to perform inter-control-loop correction when the variation amount is large, but a gain control signal is generated in each control loop in a fixed way to perform individual automatic gain control. This executes the optimum high-accuracy automatic gain control in each control system.

By setting a threshold value K2 used for decision in the operation start variation amount decision circuit 53 so that K2 is larger than the threshold value K1 used in the variation amount decision circuit 51 in the steady state of the first embodiment (K2>K1), it is possible to easily detect the variation amount at power-on when the variation amount is generally larger than that in the steady state. By combining the operation according to the third embodiment for determining the variation amounts Vad, Vbd in the detected output at power-on and the operation according to the second embodiment for starting to count a predetermined time t1 at power-on, a more minute automatic gain control at power-on can be performed.

[Fourth Embodiment]

Figure 8:
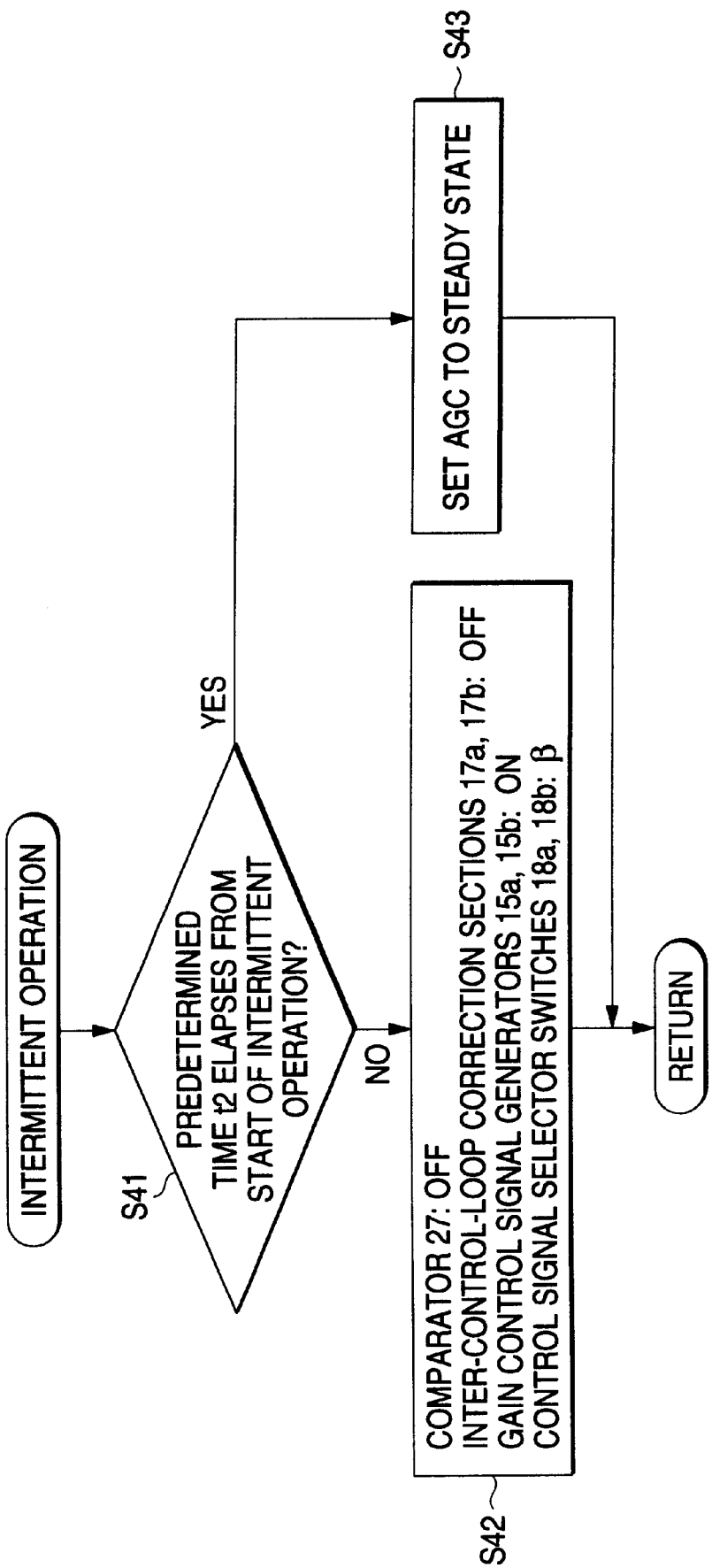
FIG. 8 is a flowchart showing the processing procedure concerning automatic gain control according to the fourth embodiment.

FIG. 8 is a flowchart showing the processing procedure concerning automatic gain control according to the fourth embodiment. The fourth embodiment is an example of the case where the automatic gain controller performs intermittent operation. This embodiment is preferable for a case where radio communications apparatus performs intermittent reception. Since the functional configuration of the control section 19 is almost the same as that of the second embodiment shown in FIG. 4, the corresponding description is not given.

In the fourth embodiment, inter-loop correction of the gain control signal is not made but a gain control signal is generated in each control loop to perform individual automatic gain control at the start of each intermittent operation, that is, in a certain period during system startup from the non-operating state to the operating state for intermittent operation, and control in the first embodiment is performed when the certain period has elapsed.

When the automatic gain controller starts intermittent operation, automatic gain control is started via a gain control signal so that the preset initial value or conversion value is approached while counting of the predetermined time t2 (sec.) (for example t2<t1) is started via the timer circuit 52. The control section 19 determines whether the predetermined time t2 (sec.) has elapsed from when the intermittent operation was started, based on the output from the timer circuit 52 in step S41.

When the predetermined time t2 (sec.) has not yet elapsed from when intermittent operation was started in step 41, the automatic gain controller places in the ON state (operating state) the gain control signal generators 15*a*, 15*b* and places in the OFF state (non-operating state) the inter-control-loop correction sections 17*a*, 17*b* and the comparator 27 as well as sets the control signal selector switches 18*a*, 18*b* in the contact β position, in step S42. This allows each control loop to perform individual automatic gain control and proper automatic gain control is executed in each control system.

When the predetermined time t2 (sec.) has elapsed from when the intermittent operation was started, the automatic gain controller performs automatic gain control operation in the steady state, that is, automatic gain control operation in the first embodiment in step S4. In this case, switching is made between the control via the gain control signal in each control loop and the control via the gain control signal in the highest level control loop and the correction gain control signal in the non-highest level control loops, depending on the magnitude of the variation amounts Vad, Vbd in the detected output.

The time when the system is unstable is generally shorter in the intermittent operation than at power-on. By setting the timer set value t2 for intermittent operation so that t2 is smaller than the timer set value t1 of the timer started at power-on, it is possible to quickly shift to automatic gain control in the steady state.

In this way, in the fourth embodiment, in a certain period during system startup from the non-operating state to the operating state for intermittent operation by the automatic gain controller, that is, in an unstable state where a large variation amount in the input signal level for intermittent operation is expected and high-accuracy automatic gain control is required, selective control is not made where operation of the control loops other than the control loop that obtains the maximum detected output is turned OFF to perform inter-control-loop correction but a gain control signal is generated in each control loop in a fixed way to perform individual automatic gain control. This executes the optimum high-accuracy automatic gain control in each control system.

[Fifth Embodiment]

Figure 9:
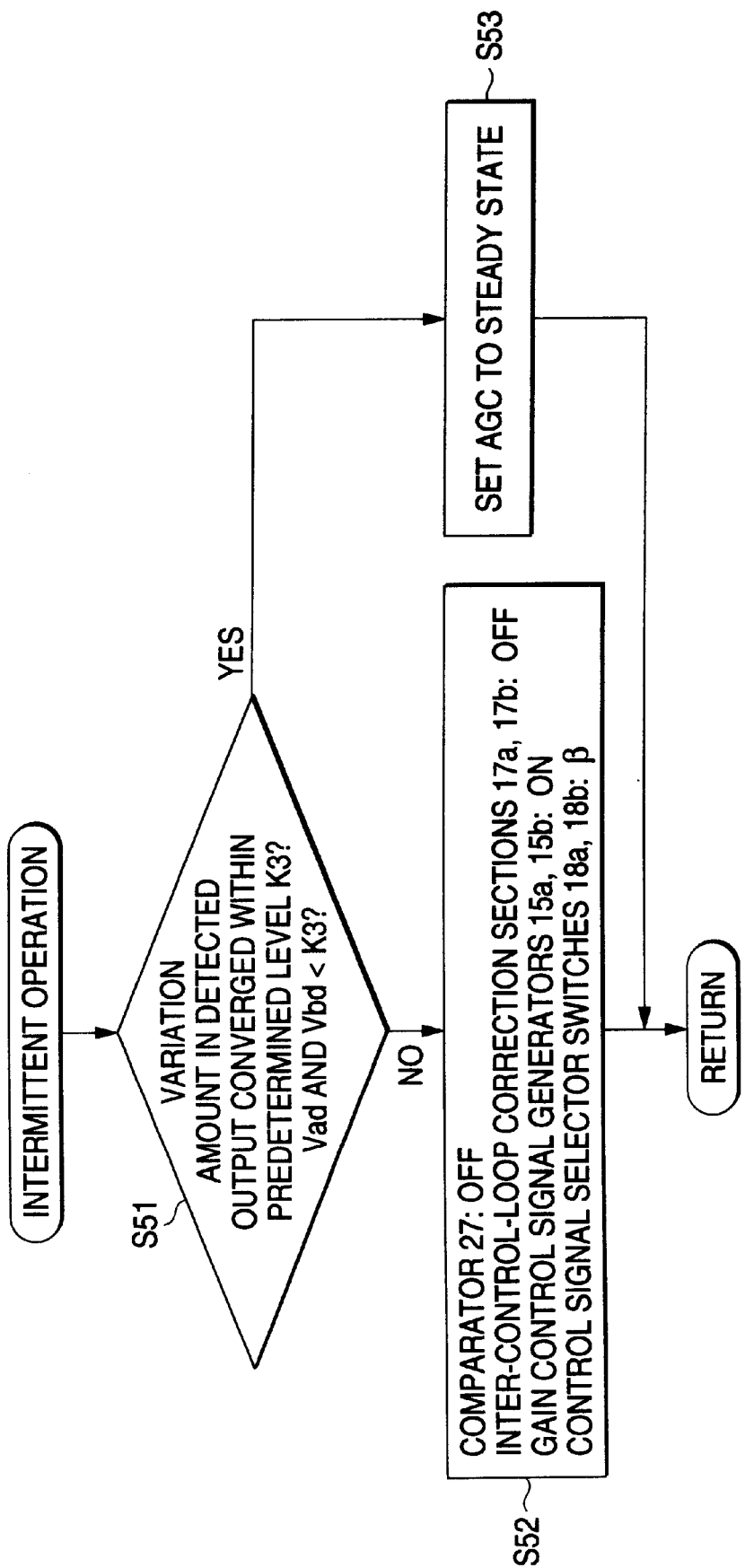
FIG. 9 is a flowchart showing the processing procedure concerning automatic gain control according to the fifth embodiment.

FIG. 9 is a flowchart showing the processing procedure concerning automatic gain control according to the fifth embodiment. The fifth embodiment is an example of the case where the automatic gain controller performs intermittent operation. This embodiment is preferable for a case where radio communications apparatus performs intermittent reception. Since the functional configuration of the control section 19 is almost the same as that of the third embodiment shown in FIG. 6, the corresponding description is not given.

In the fifth embodiment, inter-loop correction of the gain control signal is not made but a gain control signal is generated in each control loop to perform individual automatic gain control at the start of each intermittent operation, that is, during system startup from the non-operating state to the operating state for intermittent operation, and control in the first embodiment is performed when the variation amount in the detected output has fallen within a predetermined level.

When the automatic gain controller starts intermittent operation, automatic gain control is started via a gain control signal so that the preset initial value or conversion value is approached and the operation start variation amount decision circuit 53 determines whether the variation amounts Vad, Vbd have converged to a predetermined level K3 (for example K3>K1) in step S51.

In case the variation amounts Vad, Vbd in the detected output are equal to or larger than the predetermined level K3 (Vad or Vbd≧K3) in step S51, the automatic gain controller places in the ON state (operating state) the gain control signal generators 15a, 15b and places in the OFF state (non-operating state) the inter-control-loop correction sections 17a, 17b and the comparator 27 as well as sets the control signal selector switches 18a, 18b in the contact β position, in step S52. This allows each control loop to perform individual automatic gain control and proper automatic gain control is executed in each control system.

In case the variation amounts Vad, Vbd in the detected output are smaller than the predetermined level K3 (Vad and Vbd<K3), the automatic gain controller performs automatic gain control operation in the steady state, that is, automatic gain control operation in the first embodiment in step S53. In this case, switching is made between the control via the gain control signal in each control loop and the control via the gain control signal in the highest level control loop and the correction gain control signal in the non-highest level control loops, depending on the magnitude of the variation amount Vad, Vbd in the detected output.

In this way, in the fifth embodiment, during system startup from the non-operating state to the operating state for intermittent operation by the automatic gain controller, that is, in an unstable state where a large variation amount in the input signal level is expected and high-accuracy automatic gain control is required, selective control is not made where the variation amount in the detected output is determined and operation of the control loops other than the control loop that obtains the maximum detected output is turned OFF to perform inter-control-loop correction when the variation amount is large, but a gain control signal is generated in each control loop in a fixed way to perform individual automatic gain control. This executes the optimum high-accuracy automatic gain control in each control system.

By setting a threshold value K3 used for decision in the operation start variation amount decision circuit 53 so that K3 is larger than the threshold value K1 used in the variation amount decision circuit 51 in the steady state of the first embodiment and K3 is smaller than the threshold value K2 used when the power is turned on in the third embodiment (K1<K3<K2), it is possible to easily detect the variation amount at power-on and upgrade the detection accuracy in the intermittent operation where the variation amount is generally larger than that in the steady state and smaller than that at power-on. By combining the operation according to the fifth embodiment for determining the variation amounts Vad, Vbd in the detected output at the start of intermittent operation according to the fourth embodiment for starting to count a predetermined time t2 at the start of intermittent operation, a more minute automatic gain control during intermittent operation can be performed.

[Sixth Embodiment]

Figure 10:
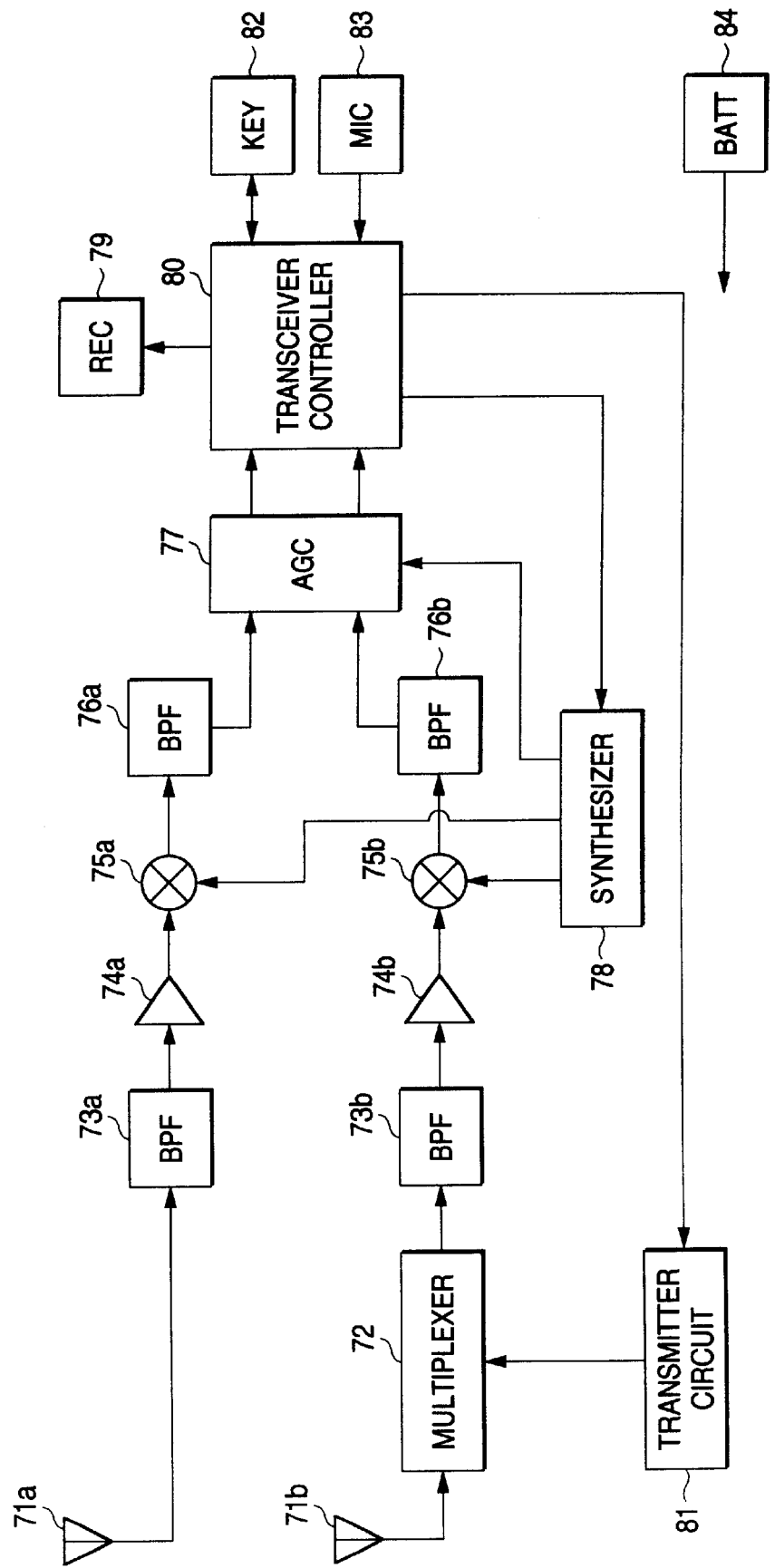
FIG. 10 is a block diagram showing the configuration of radio communications apparatus according to an embodiment of the invention.
Figure 11:
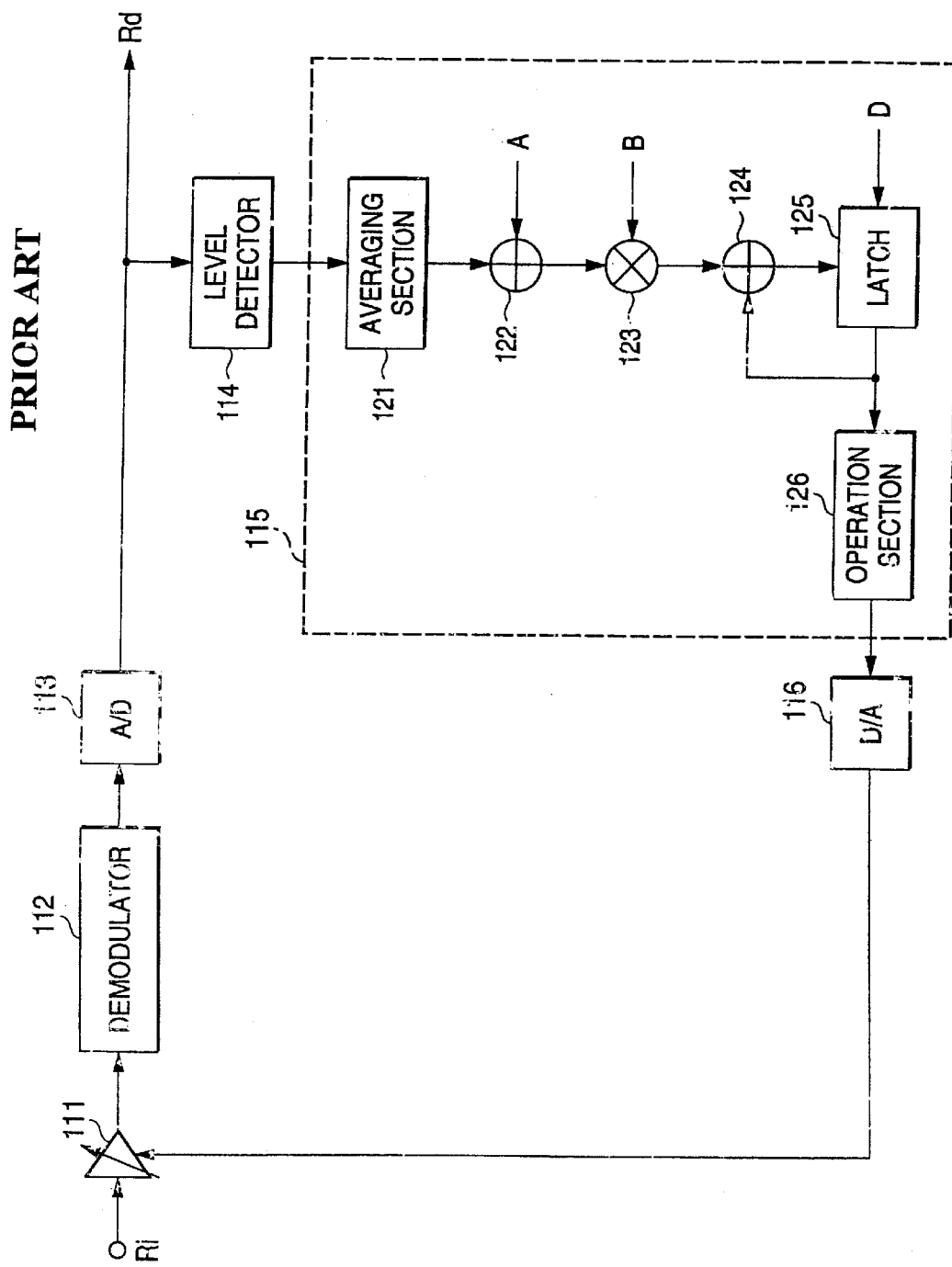
FIG. 11 is a block diagram showing an example of configuration of an automatic gain controller according to the related art applied to the receiving system of radio communications apparatus.

FIG. 10 is a block diagram showing the configuration of radio communications apparatus according to an embodiment of the invention. The sixth embodiment shows an example of configuration of radio communications apparatus equipped with an automatic gain controller according to the aforementioned first through fifth embodiments.

The radio communications apparatus is composed of receivers of a plurality of systems (two systems in this example). The radio communications apparatus comprises antennas 71a, 71b, an antenna multiplexer 72, band-pass filter (BPF) used in the RF band (radio frequency band) 73a, 73b, low-noise amplifiers 74a, 74b, down-mixers for frequency-converting signals in the RF band to signals in the IF (intermediate frequency) band, band-pass filters (BPFs) 76a, 76b used in the IF band, an automatic gain control circuit (AGC) 77, a frequency synthesizer 78, a receiver (REC) 79 for outputting received signals in the form of voice data, a transceiver controller 80 for performing control of each section, a transmitter circuit 81 for processing send signals, a key input section (KEY) 82 for performing a variety of operations, a microphone (MIC) 83 for inputting voice data as a send signal, and a battery (BATT) 84 for supplying power to each section. The automatic gain control circuit 77 formed control loops at the receivers of the systems used, as shown in the first embodiment in FIG. 1.

Operation of the radio communications apparatus will be described. When radio signals (assume for example signals in the 2-GHz band) are received via antennas 71a, 71b, the received signals pass through the antenna multiplexer 72 and signal components in a predetermined band are attenuated by the band-pass filters 73a, 73b and signal components in a desired frequency band are respectively pass through the filters and output. The received signals that passed through the band-pass filters 73a, 73b are respectively amplified by the low-noise amplifiers 74a, 74b and frequency-converted by to signals in the IF band (for example 380 [MHz] band) by the down-mixers 75a, 75b, then input to the automatic gain control circuit 77 via the band-pass filters 76a, 76b, in one system.

The received signals are demodulated by a demodulator provided in the automatic gain control circuit 77 and output to the transceiver controller 80 as baseband signals and undergo signal processing. In this practice, processing explained in the aforementioned first through fifth embodiments is performed in the control loops of the systems in the automatic gain control circuit 77. A generated gain control signal or correction gain control signal is supplied to a variable gain amplifier for preferable automatic gain control.

In case the receiving field strength is stable and variation in the received signal level is small thus receiving characteristics are not impaired by the use of an approximate gain control signal, a control loop where the output signal level is the highest is selected and automatic gain control is performed using the gain control signal in the highest-level control loop. For the other control loops, a correction gain control signal containing correction of variations in circuit characteristics in each control loop is generated based on the gain control signal to perform automatic gain control. This allows each control system to perform proper automatic gain control via a gain control signal that supports variations in the circuit characteristics such as the temperature characteristics and frequency characteristics of the variable gain amplifier. In this case, operation of the gain control signal generators in the control loops other than the highest level control loop is turned OFF so that power consumption can be reduced. In this case, control is always made by selecting a control loop where the received signal level is the highest, no excessive signals are input to the other control loops that are not selected. This avoids the disadvantage that the A/D converter in the subsequent stage of the variable gain amplifier is saturated.

On the other hand, in case the receiving field strength is unstable and the variation in the received signal level is large and high-accuracy automatic gain control is required, such as when the receiving environment has changed and signal propagation is deteriorated with fading taking place, individual automatic gain control is performed via a gain control signal in each control loop. This executes the optimum high-accuracy automatic gain control in each control system and provides operation focusing on the receiving performance, thereby obtaining a preferable received signal.

In case a large variation in the received signal level is expected and high-accuracy automatic gain control is required during system startup at power-on, individual automatic gain control is performed via a gain control signal in each control loop, without selecting the highest level control loop or correcting a gain control signal in a certain period from power-on as in the second embodiment, or until the variation amount in the detected output converges within a predetermined value as in the third embodiment. This executes the optimum high-accuracy automatic gain control in each control system and provides operation focusing on the receiving performance, thereby obtaining a preferable received signal.

In case a variation in the received signal level is large and high-accuracy automatic gain control is required during system startup when each intermittent operation is started, individual automatic gain control is performed via a gain control signal in each control loop, without selecting the highest level control loop or correcting a gain control signal in a certain period from power-on as in the fourth embodiment, or until the variation amount in the detected output converges within a predetermined value as in the fifth embodiment. This also executes the optimum high-accuracy automatic gain control in each control system and provides operation focusing on the receiving performance, thereby obtaining a preferable received signal.

As mentioned earlier, according to the invention, it is possible to execute automatic gain control of a plurality of systems depending on the operating state such as stable/unstable signal level and to obtain proper automatic gain control performance in each system as well as to reduce power consumption.

What is claimed is:

1. An automatic gain controller having variable gain amplifiers of a plurality of systems and the corresponding control loops, comprising:

a gain control signal generator which generates a gain control signal that controls a variable gain amplifier based on the output signal level of the variable gain amplifier;

a variation amount detector which detects the variation amount of the output signal level;

a level comparator which compares the output signal levels of the plurality of system with each other;

an inter-control-loop correction section which generates a correction gain control signal that corrects variations in the circuit characteristics of the other control loops and that is based on a gain control signal in the control loop where the output signal level is the highest in order to perform gain control; and an operation controller which selects the control loop where the output signal level is the highest, places the gain control signal generator for the other control loops in the non-operating state, and performs gain control of the variable gain amplifiers of the plurality of systems via the gain control signal in the control loop where the output signal level is the highest and correction gain control signals in the other control loops, in case the variation amount in the output signal level is smaller than a predetermined value.

2. An automatic gain controller according to claim 1, wherein the operation controller places in the operating state the gain control signal generator for the control loops of the plurality of systems and performs gain control of the variable gain amplifier via a gain control signal in each control loop, in case the variation amount in the output signal level is larger than the predetermined value.

3. An automatic gain controller according to claim 1, wherein the operation controller operates the gain control signal generator for each control loop in a predetermined period during system startup from the non-operational state at power-on, to perform gain control of the variable gain amplifier.

4. An automatic gain controller according to claim 1, wherein the operation controller operates the gain control signal generator for each control loop until the variation amount in the output signal level falls within a predetermined value during system startup from the non-operational state at power-on, to perform gain control of the variable gain amplifier.

5. An automatic gain controller according to claim 1, wherein the operation controller operates the gain control signal generator for each control loop in a predetermined period during system startup from the non-operational state in case intermittent operation is performed, to perform gain control of the variable gain amplifier.

6. An automatic gain controller according to claim 1, wherein the operation controller operates the gain control signal generator for each control loop until the variation amount in the output signal level falls within a predetermined value during system startup from the non-operational state in case intermittent operation is performed, to perform gain control of the variable gain amplifier.

7. An automatic gain control method using variable gain amplifiers of a plurality of systems and the corresponding control loops, comprising:

a gain control signal generating step for generating a gain control signal that control a variable gain amplifier based on the output signal level of the variable gain amplifier;

a variation amount detecting step for detecting the variation amount of the output signal;

a level comparison step for comparing the output signal levels of the plurality of system with each other;

an inter-control-loop correction step for generating a correction gain control signal that corrects variations in the circuit characteristics of the other control loops and that is based on a gain control signal in the control loop where the output signal level is the highest in order to perform gain control; and an operation control step for selecting the control loop where the output signal level is the highest, placing a gain control signal generator for the other control loops in the non-operating state, and performing gain control of the variable gain amplifiers of the plurality of systems via the gain control signal in the control loop where the output signal level is the highest and correction gain control signals in the other control loops, in case the variation amount in the output signal level is smaller than a predetermined value.

8. An automatic gain control method according to claim 7, wherein the operation control step places in the operating state the gain control signal generator for the control loops of the plurality of systems and performs gain control of the variable gain amplifier via a gain control signal in each control loop, in case the variation amount in the output signal level is larger than the predetermined value.

9. An automatic gain control method according to claim 7, wherein the operation control step operates the gain control signal generator for each control loop in a predetermined period during system startup from the non-operational state at power-on, to perform gain control of the variable gain amplifier.

10. An automatic gain control method according to claim 7, wherein the operation control step operates the gain control signal generator for each control loop until the variation amount in the output signal level falls within a predetermined value during system startup from the non-operational state at power-on, to perform gain control of the variable gain amplifier.

11. An automatic gain control method according to claim 7, wherein the operation control step operates the gain control signal generator for each control loop in a predetermined period during system startup from the non-operational state in case intermittent operation is performed, to perform gain control of the variable gain amplifier.

12. An automatic gain control method according to claim 7, wherein the operation control step operates the gain control signal generator for each control loop until the variation amount in the output signal level falls within a predetermined value during system startup from the non-operational state in case intermittent operation is performed, to perform gain control of the variable gain amplifier.

13. Radio communications apparatus having receivers of a plurality of systems comprising an automatic gain controller which includes:

a gain control signal generator which generates a gain control signal that controls a variable gain amplifier based on the output signal level of the variable gain amplifier;

a variation amount detector which detects the variation amount of the output signal level;

a level comparator which compares the output signal levels of the plurality of system with each other;

an inter-control-loop correction section which generates a correction gain control signal that corrects variations in the circuit characteristics of the other control loops and that is based on a gain control signal in the control loop where the output signal level is the highest in order to perform gain control; and an operation controller which selects the control loop where the output signal level is the highest, places the gain control signal generator for the other control loops in the non-operating state, and performs gain control of the variable gain amplifiers of the plurality of systems via the gain control signal in the control loop where the output signal level is the highest and correction gain control signals in the other control loops, in case the variation amount in the output signal level is smaller than a predetermined value.

* * * * *